(12) United States Patent
Shimada et al.

(10) Patent No.: US 6,787,830 B2
(45) Date of Patent: Sep. 7, 2004

(54) SEMICONDUCTOR DEVICE AND METHOD FOR FABRICATING THE SAME (75) Inventors: Yasuhiro Shimada, Muko (JP); Yoshihisa Kato, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/804,311

(22) Filed: Mar. 13, 2001

(65) Prior Publication Data

US 2002/0024073 A1 Feb. 28, 2002

(30) Foreign Application Priority Data

Mar. 13, 2000 (JP) ........................................ 2000-068338

(51) Int. Cl.⁷ .............................................. H01L 29/72
(52) U.S. Cl. ...................... 257/295; 257/296; 438/199; 438/210; 438/218; 438/241
(58) Field of Search ................................ 257/295, 296; 438/199, 210, 218, 241

(56) References Cited

U.S. PATENT DOCUMENTS

| 4,888,630 | A | * | 12/1989 | Paterson | ..................... 257/295 |
|---|---|---|---|---|---|
| 5,550,770 | A | | 8/1996 | Kuroda | |
| 5,721,700 | A | | 2/1998 | Katoh | |
| 5,737,261 | A | | 4/1998 | Taira | |
| 5,751,037 | A | | 5/1998 | Aozasa et al. | |

FOREIGN PATENT DOCUMENTS

| JP | 5-090532 A | 4/1993 | |
|---|---|---|---|
| JP | 06-125066 | 5/1994 | |
| JP | 08-264665 A | 10/1996 | |
| JP | 09-069615 A | 3/1997 | |
| JP | 9-205181 A | 8/1997 | |
| JP | 11-54636 A | 2/1999 | |
| JP | 11-054716 A | 2/1999 | |
| JP | 11-054716 A | * 2/1999 | ................. 257/295 |
| JP | 11-284500 | 10/1999 | |

* cited by examiner

Primary Examiner—Edward Wojciechowicz
(74) Attorney, Agent, or Firm—Nixon Peabody LLP; Donald R. Studebaker (57) ABSTRACT A gate electrode and a gate insulating film are formed for each of PMOSFET, NMOSFET and ferroelectric FET. Source/drain regions are defined for the NMOSFET and ferroelectric FET and for the PMOSFET by performing ion implantation processes twice separately. An intermediate electrode connected to the gate electrode of the ferroelectric FET, a ferroelectric film and a control gate electrode are formed over a first interlevel dielectric film. An interconnect layer, which includes first and second interconnects and is connected to the gate electrodes of the CMOS device, is formed on a second interlevel dielectric film. The first and second interconnects are connected to the control gate and intermediate electrodes of the ferroelectric FET, respectively.

6 Claims, 6 Drawing Sheets

SEMICONDUCTOR DEVICE AND METHOD FOR FABRICATING THE SAME

BACKGROUND OF THE INVENTION

The present invention relates to an improved semiconductor device including: a memory cell, in which the gate potential of a field effect transistor (FET) is controlled using a ferroelectric capacitor; and complementary MOS field effect transistors (CMOS).

An FET, called "MFISFET", "MFSFET" or "MFMISFET", has been known as a semiconductor memory device including a non-volatile storage section with a ferroelectric thin film in its gate. An FET with such a structure will be herein called a "FeFET".

Figure 6:
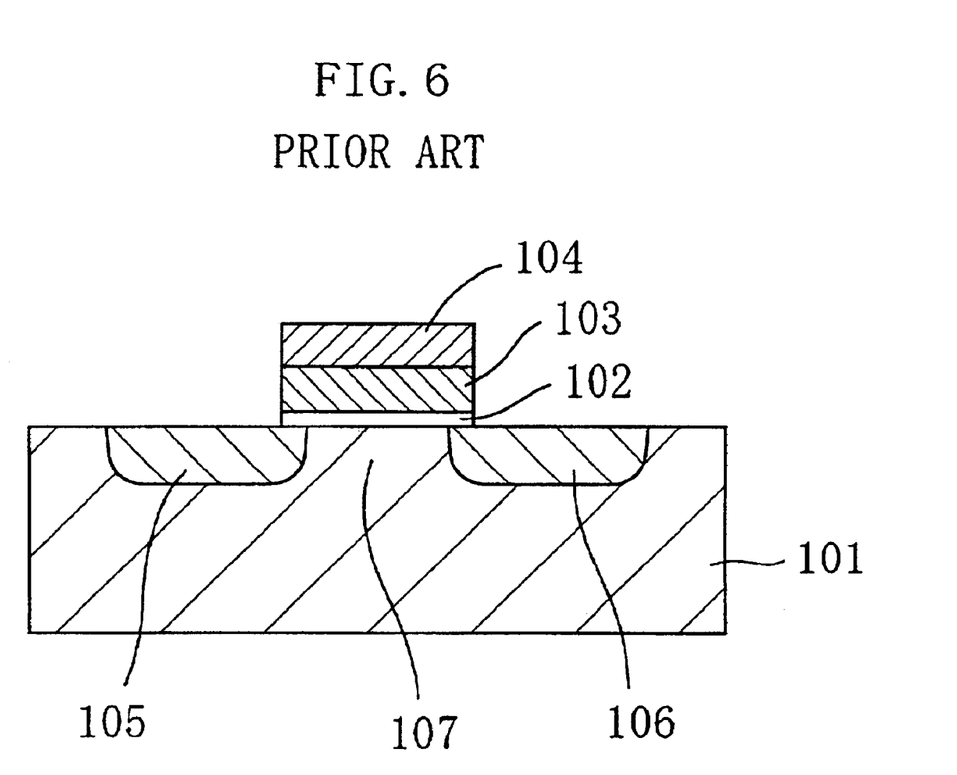
FIG. 6 is a cross-sectional view of a known ferroelectric FET implemented as an MFISFET.

FIG. 6 is a cross-sectional view of a known FeFET implemented as an MFISFET. As shown in FIG. 6, the FET includes silicon substrate 101, silicon dioxide ($SiO_2$) film 102, ferroelectric film 103, gate electrode 104 and source/drain regions 105 and 106. The $SiO_2$ film 102, ferroelectric film 103 and gate electrode 104 are stacked in this order on the substrate 101. The ferroelectric film 103 is made of a metal oxide such as lead zirconate titanate (PZT) or bismuth strontium tantalate (SBT). The gate electrode 104 is made of a conductor like platinum (Pt). And the source/drain regions 105 and 106 are defined in the substrate 101 and located on right- and left-hand sides of the gate electrode 104. In this device, part of the substrate 101 under the $SiO_2$ film 102 serves as a channel region 107.

In the structure shown in FIG. 6, the ferroelectric film 103 exhibits electric spontaneous polarization of one of the following two types. More specifically, the electric dipole moment in the film 103 is either upward or downward depending on the polarity of a voltage applied between the gate electrode 104 and substrate 101. As used herein, the "upward electric dipole moment" refers to the electric moment of electric dipoles showing positive polarity at their upper end, while the "downward electric dipole moment" refers to the electric moment of electric dipoles showing positive polarity at their lower end. The ferroelectric film 103 also shows dielectric hysteresis. That is to say, even after the voltage applied is removed, the polarization of either type remains in the film 103. Thus, the film 103 exhibits one of these two different types of remnant polarization while zero voltage is applied to the gate electrode 104. As a result, the channel region 107 of the FeFET enters one of two different states with mutually different potential depths corresponding to these two different types of remnant polarization. On the other hand, the source-drain resistance of the FeFET changes with the potential depth in the channel region 107. Accordingly, it depends on the type of remnant polarization exhibited by the ferroelectric film 103 whether the source-drain resistance becomes relatively high or relatively low. And one of these two different states, corresponding to the high and low source-drain resistance values, respectively, is retained (or stored) so long as the ferroelectric film 103 keeps its remnant polarization. This is why a nonvolatile memory device is realized by a FeFET like this.

In a nonvolatile memory device using the known FeFET, one state assumed by the ferroelectric film 103 with the down remnant polarization is normally associated with data "1". The other state assumed by the ferroelectric film 103 with the up remnant polarization is normally associated with data "0". To create the down remnant polarization in the ferroelectric film 103, a positive voltage may be applied to the gate electrode 104 with the backside of the substrate 101 grounded, and then the voltage applied to the electrode 104 may be reset to the ground level, for example. The up remnant polarization can be created in the ferroelectric film 103 in a similar manner. Specifically, first, a negative voltage may be applied to the gate electrode 104 with the backside of the substrate 101 grounded, and then the voltage applied to the electrode 104 may be reset to the ground level, for example.

However, no structure proposed so far is highly qualified to operate a FeFET like this fully in an integrated circuit. Accordingly, it is still difficult to sufficiently increase the number of device integrated in, or significantly reduce the overall cost of, a semiconductor integrated circuit including an array of memory cells utilizing the FeFET, a driver circuit thereof, and a logic circuit like a processor.

SUMMARY OF THE INVENTION

It is therefore an object of the present invention to make full use of a ferroelectric FET as a memory cell in an integrated circuit by providing a hybrid semiconductor device where a memory and a transistor for controlling the memory are integrated on the same chip.

An inventive semiconductor device includes: a semiconductor substrate; an MISFET, which is provided on the semiconductor substrate and includes a gate insulating film, a gate electrode and source/drain regions; and a ferroelectric FET, which is provided on the semiconductor substrate and includes a ferroelectric film, a control gate electrode provided on the ferroelectric film and source/drain regions.

In this structure, ferroelectric FET and MISFET are provided on the same semiconductor substrate. Accordingly, the ferroelectric FET can be used as a memory cell while the MISFET can be used as a transistor for driving the memory cell. In other words, it is possible to provide a hybrid semiconductor device where a memory cell and a transistor for controlling the memory cell are integrated on the same chip.

In one embodiment of the present invention, the ferroelectric FET preferably further includes: a gate insulating film provided on a part of the substrate, which part is located between the source/drain regions of the ferroelectric FET; a gate electrode provided on the gate insulating film of the ferroelectric FET; an interlevel dielectric film covering at least the gate electrode of the ferroelectric FET; an intermediate electrode provided on the interlevel dielectric film; and a contact member connecting the intermediate electrode and the gate electrode of the ferroelectric FET together. And the ferroelectric film is preferably provided on the intermediate electrode. In such an embodiment, the interlevel dielectric film exists between the ferroelectric film and the semiconductor substrate. Accordingly, the constituent elements of the ferroelectric film will not diffuse and reach the substrate. As a result, the ferroelectric FET will not operate erroneously.

In another embodiment, the gate electrode of the ferroelectric FET and the gate electrode of the MISFET may be formed out of the same conductor film. In such an embodiment, the fabrication cost can be reduced.

In still another embodiment, the inventive device preferably further includes a first interconnect connected to the intermediate electrode; and a second interconnect connected to the control gate electrode. And polarization may be created in the ferroelectric film with a voltage applied between the first and second interconnects. In such an embodiment, the absolute value of the voltage applied when downward polarization should be created in the ferroelectric film can be arbitrarily made different from that of the voltage applied when upward polarization should be created in the ferroelectric film. As a result, data can be written on the ferroelectric film so that no read error will occur due to the disturb phenomenon that decreases the remnant polarization of the ferroelectric film little by little.

In yet still another embodiment, the inventive device preferably further includes: a memory circuit block, in which the ferroelectric FETs are arranged; and a control circuit block, in which the MISFETs are arranged, for controlling the memory circuit block.

An inventive method for fabricating a semiconductor device includes the steps of: a) forming a gate insulating film and a gate electrode for each of first- and second-channel-type MISFETs and a ferroelectric FET over a semiconductor substrate; b) implanting ions of a dopant for forming source/drain regions from over the gate electrode of the ferroelectric FET and the gate electrode of one of the first- and second-channel-type MISFETs; c) implanting ions of another dopant for forming source/drain regions from over the gate electrode of the other MISFET; d) forming an interlevel dielectric film covering the gate electrodes of the MISFETs and the ferroelectric FET, forming a contact hole, which passes through the interlevel dielectric film to reach the gate electrode of the ferroelectric FET, and then filling the contact hole with a conductor material to form a contact member; and e) forming an intermediate electrode, a ferroelectric film and a control gate electrode over the interlevel dielectric film so that the intermediate electrode is connected to the contact member and that the ferroelectric film is in contact with an upper surface of the intermediate electrode and that the control gate electrode faces the intermediate electrode with the ferroelectric film interposed therebetween.

In one embodiment of the present invention, the inventive method preferably further includes the steps of: f) forming an upper-level dielectric film on the interlevel dielectric film after the step e) has been performed; g) forming two contact holes, which pass through the upper-level dielectric film to reach the intermediate and control gate electrodes of the ferroelectric FET, respectively, and then filling the contact holes with a conductor material to form first and second contact members, which make electrical contact with the intermediate and control gate electrodes, respectively; and h) forming first and second interconnects, which are connected to the first and second contact members, respectively, on the upper-level dielectric film.

DESCRIPTION OF THE PREFERRED EMBODIMENTS

Embodiment 1

Hereinafter, a semiconductor device and a method for fabricating the device according to a first embodiment of the present invention will be described. FIGS. 1A through 1D are cross-sectional views illustrating respective process steps for fabricating the semiconductor device of the first embodiment.

Figure 1A:
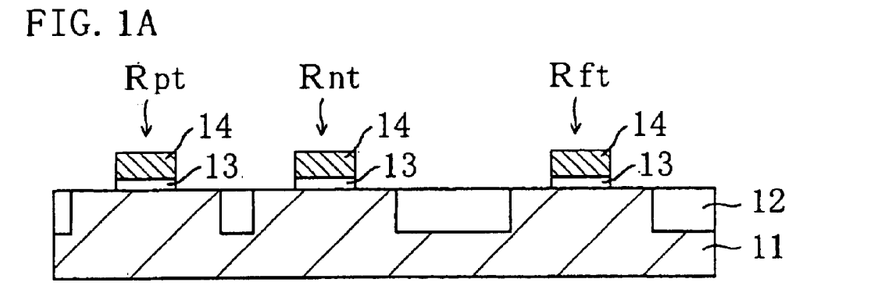
FIGS. 1A through 1D are cross-sectional views illustrating respective process steps for fabricating a semiconductor device according to a first embodiment of the present invention.

First, in the process step shown in FIG. 1A, by utilizing a well-known technique, a trench isolation film 12 surrounding active regions is formed in a silicon substrate 11. In the illustrated embodiment, the active regions include regions Rpt, Rnt and Rft where PMOSFET, NMOSFET and FeFET will be formed, which will be herein called "PMOSFET region Rpt", "NMOSFET region Rnt" and "FeFET region Rft", respectively. Next, a silicon dioxide film is formed on the active regions by a thermal oxidation process and then a polysilicon film is deposited on the silicon dioxide film. Subsequently, the polysilicon and silicon dioxide films are patterned by photolithography and dry etching processes, thereby forming respective gate electrodes 14 and respective gate insulating films 13 for the PMOSFET, NMOSFET and FeFET.

Figure 1B:
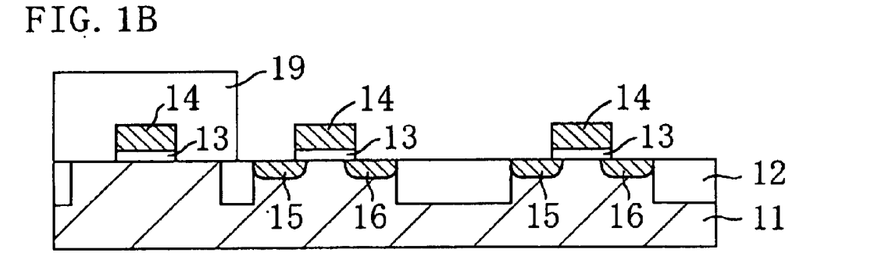

Next, in the process step shown in FIG. 1B, a resist mask 19 covering the PMOSFET region Rpt is defined. Then, by implanting ions of an n-type dopant (e.g., arsenic (As)) from over the resist mask 19, source/drain regions 15 and 16 are defined for the NMOSFET and FeFET.

Subsequently, in the process step shown in FIG. 1C, the resist mask 19 is stripped. Thereafter, another resist mask (not shown) covering the NMOSFET region Rnt and FeFET region Rft is defined. Then, by implanting ions of a p-type dopant (e.g., boron fluoride) from over this resist mask, source/drain regions 17 and 18 are defined for the PMOSFET.

Further, a first interlevel dielectric film 20 of silicon dioxide is deposited over the substrate. Subsequently, a contact hole, passing through the first interlevel dielectric film 20 to reach the gate electrode 14 of the resultant FeFET, is formed. Thereafter, the contact hole is filled with polysilicon, thereby forming a polysilicon plug 21 as a contact member. Then, a Pt (platinum) film is deposited on the first interlevel dielectric film 20 and then patterned, thereby forming an intermediate electrode 22 connected to the polysilicon plug 21. Further, a ferroelectric film 23 made of a metal oxide such as lead zirconate titanate (PZT) or bismuth strontium tantalate (SBT) is formed on the intermediate electrode 22. In this case, the ferroelectric film 23 of a metal oxide is separated from the gate electrode 14 by the first interlevel dielectric film 20. Therefore, even if the ferroelectric film 23 is baked at a high temperature within an oxygen ambient, no constituent elements of the ferroelectric film 23 diffuse into the silicon substrate 11. Furthermore, a control gate electrode 24 of platinum is formed on the ferroelectric film 23. This control gate electrode 24 controls the operation of the resultant FeFET.

Figure 1C:
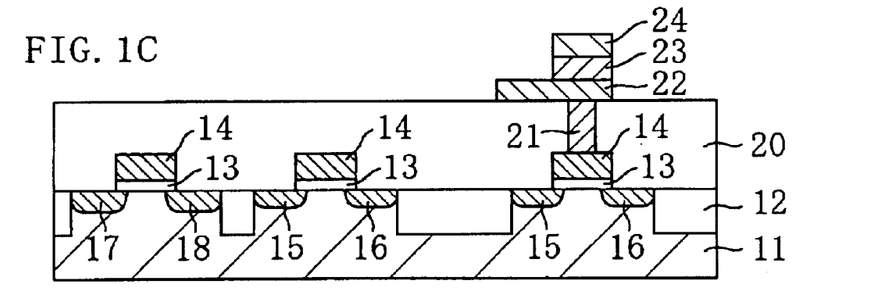

It should be noted that, in FIG. 1C, the polysilicon plug 21, which makes electrical contact with the gate electrode 14 of the FeFET, is formed over the active region. Actually, though, the polysilicon plug 21 is often formed on part of the gate electrode 14 existing over the isolation film 12.

Figure 1D:
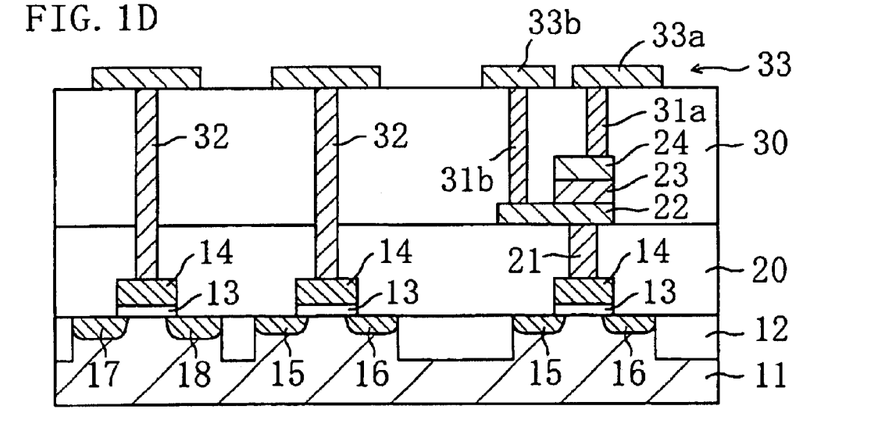

Next, in the process step shown in FIG. 1D, a second interlevel dielectric film 30 of silicon dioxide is deposited on the first interlevel dielectric film 20. Subsequently, via holes, passing through the second interlevel dielectric film 30 to reach the control gate electrode 24 and intermediate electrode 22, are formed. Then, the via holes are filled with tungsten (W) to form first and second tungsten plugs 31a and 31b as contact members. In this process step, contact holes, passing through the first and second interlevel dielectric films 20 and 30 to reach the gate electrodes 14 of the NMOSFET and PMOSFET, are also formed. Then, the contact holes are also filled with tungsten to form tungsten plugs 32.

In FIG. 1D, the tungsten plugs 32, which make electrical contact with the gate electrodes 14 of the respective MOSFETs, are formed over the active regions. Actually, though, each of the tungsten plugs 32 is often formed on part of the gate electrode 14 existing over the isolation film 12.

Further, a metal film like an aluminum alloy film is deposited on the second interlevel dielectric film 30 and then patterned, thereby forming an interconnect layer 33 connected to the tungsten plugs 31a, 31b and 32. The interconnect layer 33 includes a first interconnect 33a, connected to the control gate electrode 24 via the first tungsten plug 31a, and a second interconnect 33b, connected to the intermediate electrode 22 via the second tungsten plug 31b.

Although not shown in FIG. 1D, another upper-level dielectric film is formed on the first or second interlevel dielectric film 20 or 30. Then another interconnect layer is formed on the upper-level dielectric film. Specifically, this interconnect layer is connected to the source/drain regions 15 and 16 of the NMOSFET, source/drain regions 17 and 18 of the PMOSFET and source/drain regions 15 and 16 of the FeFET via conductor plugs. Also, interconnects connected to respective parts of the FeFET and interconnects connected to respective parts of the NMOSFET and PMOSFET are connected together somewhere. That is to say, the device is so constructed that data can be written, read or altered on/from a memory cell formed as the FeFET using a control circuit including the NMOSFET and PMOSFET.

By performing these process steps, the FeFET and the NMOSFET and PMOSFET of the CMOS device can be formed on the same semiconductor substrate. In other words, peripheral circuits for using a FeFET memory cell as a memory and a memory array can be integrated on the same substrate. Also, it is possible to form a large scale integrated circuit such as a so-called "system LSI", in which not only a memory circuit, including the memory array and peripheral circuits, but also a logic circuit (e.g., processor), including arithmetic and logic units, are integrated on a single chip.

Moreover, the FeFET is implemented by forming the intermediate electrode 22 connected to the gate electrode 14 and then forming the ferroelectric film 23 and control gate electrode 24 over this intermediate electrode 22. Accordingly, as will be described later, data can be read form the FeFET memory cell more accurately. Also, in the process step shown in FIG. 1A, by patterning a single polysilicon film, the gate electrodes 14 of the FeFET and respective MOSFETs can be formed at a time. As a result, the fabrication process can be simplified.

Furthermore, in the process step shown in FIG. 1B, when the FeFET and the NMOSFET and PMOSFET of the CMOS device are formed, the source/drain regions of the NMOSFET and FeFET can be defined at a time by implanting ions of the same dopant. As a result, the number of photolithographic process steps can be reduced, and the fabrication process can be simplified.

Moreover, in the process step shown in FIG. 1C, when the ferroelectric film 23 is baked at a high temperature, the first interlevel dielectric film 20 suppresses the diffusion of the constituent elements of the ferroelectric film 23 into the silicon substrate 11. As a result, the electrical continuity between the source/drain regions of the FeFET is retained well.

Embodiment 2

Hereinafter, a semiconductor device and a method for fabricating the device according to a second embodiment of the present invention will be described. FIGS. 2A through 2D are cross-sectional views illustrating respective process steps for fabricating the semiconductor device of the second embodiment.

Figure 2A:
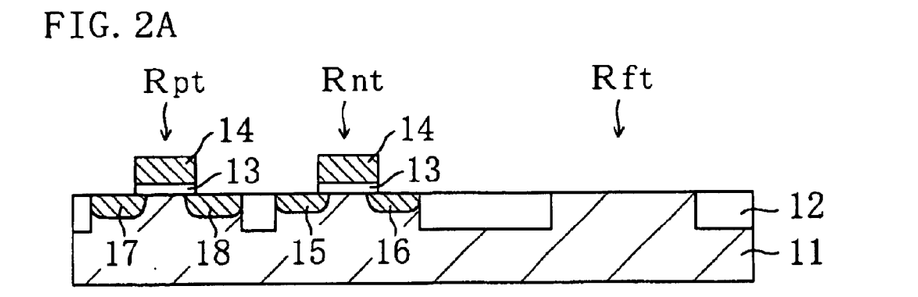
FIGS. 2A through 2D are cross-sectional views illustrating respective process steps for fabricating a semiconductor device according to a second embodiment of the present invention.

First, in the process step shown in FIG. 2A, by utilizing a well-known technique, a trench isolation film 12 surrounding active regions is formed in a silicon substrate 11. In the illustrated embodiment, the active regions include the PMOSFET, NMOSFET and FeFET regions Rpt, Rnt and Rft. Next, a silicon dioxide film is formed on the active regions by a thermal oxidation process and then a polysilicon film is deposited on the silicon dioxide film. Subsequently, the polysilicon and silicon dioxide films are patterned by photolithography and dry etching processes, thereby forming respective gate electrodes 14 and respective gate insulating films 13 for the PMOSFET and NMOSFET. It is noted that no gate oxide film or no gate electrode is formed in the FeFET region Rft at this point in time.

Next, a resist mask (not shown) covering the FeFET region Rft and PMOSFET region Rpt is defined. Then, by implanting ions of an n-type dopant (e.g., arsenic (As)) from over the resist mask, source/drain regions 15 and 16 are defined for the NMOSFET. Subsequently, the resist mask is stripped. Thereafter, another resist mask (not shown) covering the FeFET region Rft and NMOSFET region Rnt is defined. Then, by implanting ions of a p-type dopant (e.g., boron fluoride) from over the resist mask, source/drain regions 17 and 18 are defined for the PMOSFET.

Figure 2B:
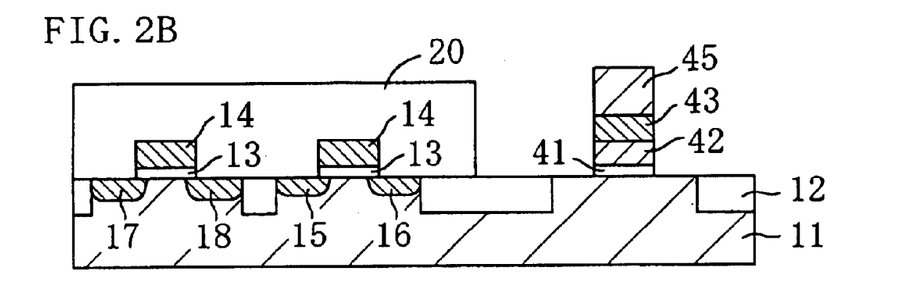

Subsequently, in the process step shown in FIG. 2B, a silicon dioxide film is deposited over the substrate and then patterned, thereby forming a first interlevel dielectric film 20. Specifically, the first interlevel dielectric film 20 covers the NMOSFET region Rnt and PMOSFET region Rpt and has an opening over the FeFET region Rft. Subsequently, thermal oxide, ferroelectric and Pt films are stacked in this order over the FeFET region Rft and then a resist mask 45 for forming a control gate electrode is defined. Thereafter, the thermal oxide, ferroelectric and Pt films are etched using the resist mask 45, thereby forming gate oxide film 41, patterned ferroelectric film 42 and control gate electrode 43 of Pt (platinum). The ferroelectric film 42 is made of a metal oxide such as lead zirconate titanate (PZT) or bismuth strontium tantalate (SBT). In this process step, the ferroelectric film 42 is baked at a high temperature within an oxygen ambient.

Figure 2C:
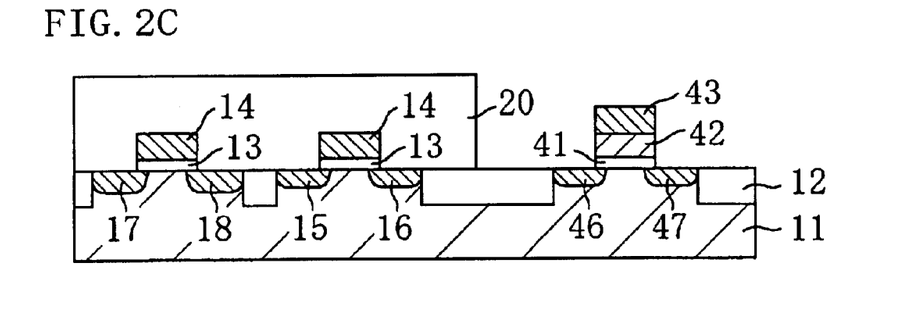

Next, in the process step shown in FIG. 2C, by implanting ions of an n-type dopant (e.g., arsenic (As)) from over the control gate electrode 43, source/drain regions 46 and 47 are defined for the FeFET.

Subsequently, in the process step shown in FIG. 2D, a silicon dioxide film is deposited over the substrate and then the upper surface of the substrate is planarized by a CMP process. In this manner, a second interlevel dielectric film 30 is formed. Next, a contact hole, passing through the second interlevel dielectric film 30 to reach the control gate electrode 43 of the resultant FeFET, is formed. Thereafter, the contact hole is filled with tungsten (W), thereby forming a tungsten plug 48. In this process step, two more contact holes, passing through the second and first interlevel dielectric films 30 and 20 to reach the gate electrodes 14 of the NMOSFET and PMOSFET, are also formed. Then, the contact holes are filled with tungsten (W) to form tungsten plugs 49.

Figure 2D:
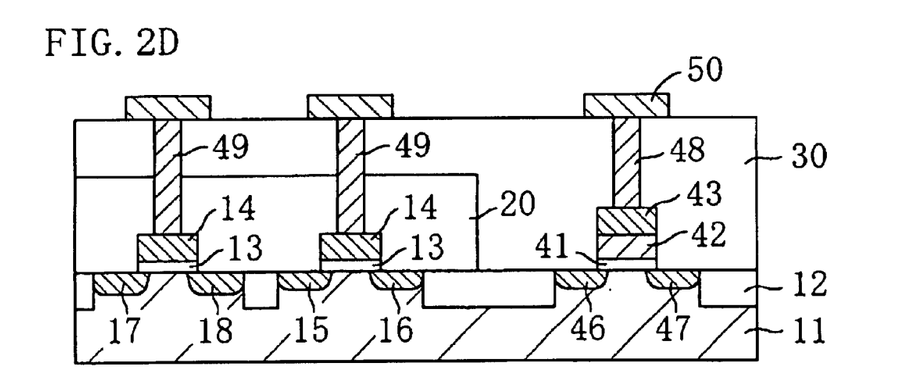

In FIG. 2D, the tungsten plugs 48 and 49, which make electrical contact with the control gate electrode 43 of the FeFET and the gate electrodes 14 of the MOSFETS, respectively, are formed over the active regions. Actually, though, each of the tungsten plugs 48 and 49 is often formed on part of the gate electrode 14 or control gate electrode 43 existing over the isolation film 12.

Further, a metal film like an aluminum alloy film is deposited on the second interlevel dielectric film 30 and then patterned, thereby forming an interconnect layer 50 connected to the respective tungsten plugs 48 and 49.

Although not shown in FIG. 2D, a third interlevel dielectric film may be formed on the second interlevel dielectric film 30 and then another interconnect layer may be formed on the third interlevel dielectric film. Specifically, in that case, the interconnect layer may be connected to the source/drain regions 15 and 16 of the NMOSFET, source/drain regions 17 and 18 of the PMOSFET and source/drain regions 46 and 47 of the FeFET via conductor plugs.

By performing these process steps, the FeFET and the NMOSFET and PMOSFET of the CMOS device can be formed on the same semiconductor substrate. In other words, peripheral circuits for using an FeFET memory cell as a memory and a memory array can be integrated on the same substrate. Also, it is possible to form a large scale integrated circuit such as a so-called "system LSI", in which not only a memory circuit, including the memory array and peripheral circuits, but also a logic circuit (e.g., processor), including arithmetic and logic units, are integrated on a single chip.

Embodiment 3

Figure 3:
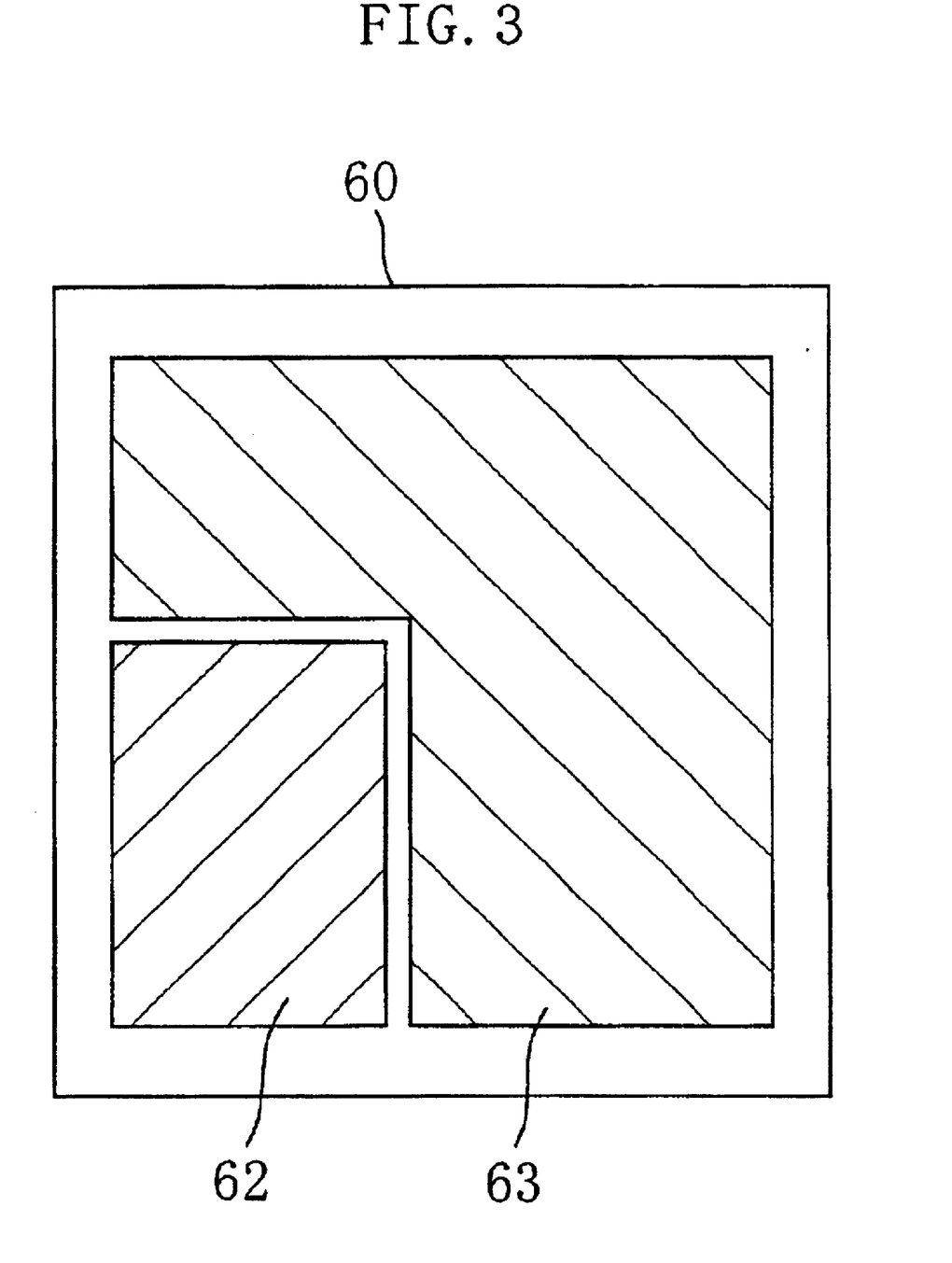
FIG. 3 is a plan view illustrating a semiconductor integrated circuit, in which memory and logic circuits are integrated together on a single chip, according to a third embodiment of the present invention.

FIG. 3 is a plan view illustrating a semiconductor integrated circuit, in which memory and logic circuits are integrated together on a single chip, according to a third embodiment of the present invention.

As shown in FIG. 3, the circuit of this embodiment includes a memory circuit block 62 and a CMOS circuit block 63 that are integrated on a silicon chip 60. The memory circuit block 62 includes a memory array, in which the FeFETs are arranged as memory cells. Also, the CMOS circuit block 63 is implemented as a block including control circuits (peripheral circuits) for driving the memory circuit block 62 and a logic circuit such as a processor.

As shown in FIG. 3, by forming the FeFETs and CMOS devices on a single substrate, a large scale integrated circuit is obtainable. Specifically, the large scale integrated circuit includes: a memory circuit, in which nonvolatile memory cells are arranged; circuits for controlling the memory circuit; and a logic circuit such as a processor, all of which are integrated on a single chip.

In this embodiment, either the FeFETs of the first embodiment or those of the second embodiment may be arranged in the memory circuit block 62. In either case, it is possible to integrate the FeFETs for the memory circuit block 62 and the NMOSFETs and PMOSFETs for the CMOS circuit block 63 on the same semiconductor substrate.

Comparison Between Fabricating Methods of the First and Second Embodiments

The overall height of the FeFET of the second embodiment is much smaller than that of the FeFET of the first embodiment, and the upper surface of the second interlevel dielectric film 30 can be located at an even lower level. In this respect, the second embodiment is more advantageous.

However, according to the first embodiment, in the process step shown in FIG. 1B, the source/drain regions of the NMOSFET and FeFET can be defined at a time by implanting ions of the same dopant. Accordingly, the first embodiment needs a smaller number of photolithographic process steps. Further, according to the second embodiment, in the process step shown in FIG. 2C, an implant angle, at which dopant ions are implanted to form source/drain regions for the FeFET, is restricted due to the existence of the first interlevel dielectric film 20. Furthermore, in the first embodiment, when the ferroelectric film 23 is baked at a high temperature in the process step shown in FIG. 1C, the diffusion of the constituent elements of the ferroelectric film 23 into the silicon substrate 11 is suppressed by the first interlevel dielectric film 20. Accordingly, the electrical continuity between the source/drain regions of the FeFET can be retained well. In contrast, in the second embodiment, when the ferroelectric film 42 is baked at a high temperature in the process step shown in FIG. 2B, the constituent elements of the ferroelectric film 42 might diffuse into the silicon substrate 11.

The Performance Comparison Between the Devices of the First and Second Embodiments In the FeFET of the first embodiment, as opposed to the second embodiment, the absolute value of the voltage applied to the ferroelectric film 23 when data should be written to create down remnant polarization can be different from that of the voltage applied thereto when data should be written to create up remnant polarization in the ferroelectric film 23. Specifically, the down remnant polarization means that the polarity is positive at the lower end while it is negative at the upper end. And the up remnant polarization means that the polarity is positive at the upper end while it is negative at the lower end. In other words, in the second embodiment, when polarization should be created in the ferroelectric film 42, a voltage is applied between the control gate electrode 24 and silicon substrate 11. Therefore, it is actually hard to make a difference in the absolute value of the voltage applied depending on whether downward or upward polarization should be created in the ferroelectric film 42. In contrast, in the first embodiment when data is written, polarization can be created in the ferroelectric film 23 by applying a voltage between the control gate and intermediate electrodes 24 and 22. Accordingly, the absolute value of the voltage applied when downward polarization should be created can be arbitrarily made different from that of the voltage applied when upward polarization should be created. Hereinafter, driving methods suitably applicable to writing and reading data on/from the FeFET of the first embodiment will be described.

How to Set Gate Bias

Figure 4:
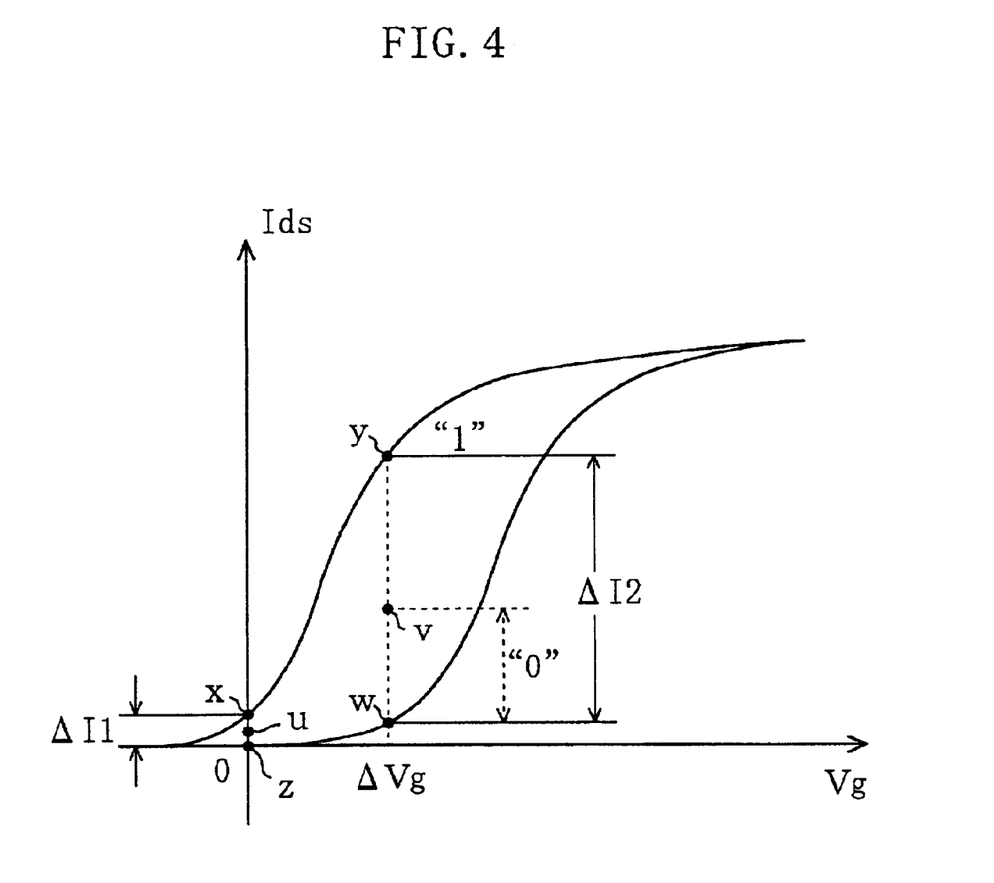
FIG. 4 is a graph showing how to set a gate bias $\Delta Vg$ when an FeFET memory cell is read.

FIG. 4 is a graph showing how to set a gate bias $\Delta Vg$ (i.e., a voltage applied to the control gate electrode 24 or 43) when a memory cell including the FeFET is read. As shown in FIG. 4, if data is read with no bias applied to the control gate electrode 24 or 43, the difference $\Delta I1$ in the amount of read current flowing between the data "1" and data "0" states is small. For that reason, according to the present invention, a bias is preferably applied to the control gate electrode 24 or 43 during reading. Hereinafter, the performance of the known and inventive memory cells will be compared to each other based on this supposition. Specifically, the source-drain current Ids of the FeFET depends on the gate bias. In this embodiment, the gate bias Vg is set to such a value $\Delta Vg$ as maximizing the difference in the amount of read current flowing between the data "1" and data "0" states in accordance with the gate bias dependence of the source-drain current Ids. And the gate voltage Vg is set to a value greater than zero volt by $\Delta$Vg during reading. In other words, an offset voltage of $\Delta$Vg is applied to the control gate electrode 24 or 43 to increase the SNR of a read signal.

Disturb Phenomenon

In this method, however, the offset voltage $\Delta$Vg is applied to the control gate electrode 24 or 43 of the FeFET every time a read operation is performed. For example, suppose a positive offset voltage $\Delta$Vg is applied to the control gate electrode. In that case, if the remnant polarization is downward (i.e., in the data "1" state), then the direction of the remnant polarization is the same as the direction of polarization induced by an electric field created by the gate bias. Accordingly, the remnant polarization is not affected by the gate bias. However, if the remnant polarization is upward (i.e., in the data "0" state), then the direction of the remnant polarization is opposite to the direction of polarization induced by an electric field created by the gate bias. In that case, every time the offset voltage $\Delta$Vg is applied to the gate electrode, the remnant polarization in the ferroelectric film decreases little by little. So if the read operation is repeatedly performed on the ferroelectric film many times, the remnant polarization in the ferroelectric film will eventually reach almost zero. A phenomenon like this, or the unintentional, gradual data loss caused by repeatedly applying, as a gate voltage, a voltage creating an electric field in such a direction as weakening the remnant polarization, is called a "disturb phenomenon".

As the remnant polarization decreases little by little due to the disturb phenomenon, the channel potential of the known FeFET, where data "0" has been stored, will get closer to the channel potential of the FET where data "1" has been stored. Accordingly, the source-drain current Ids, corresponding to the data "0" state, gradually changes from its initial value. This is an unfavorable phenomenon that should be eliminated in designing a read circuit.

Preferred Data Writing Method

Figure 5:
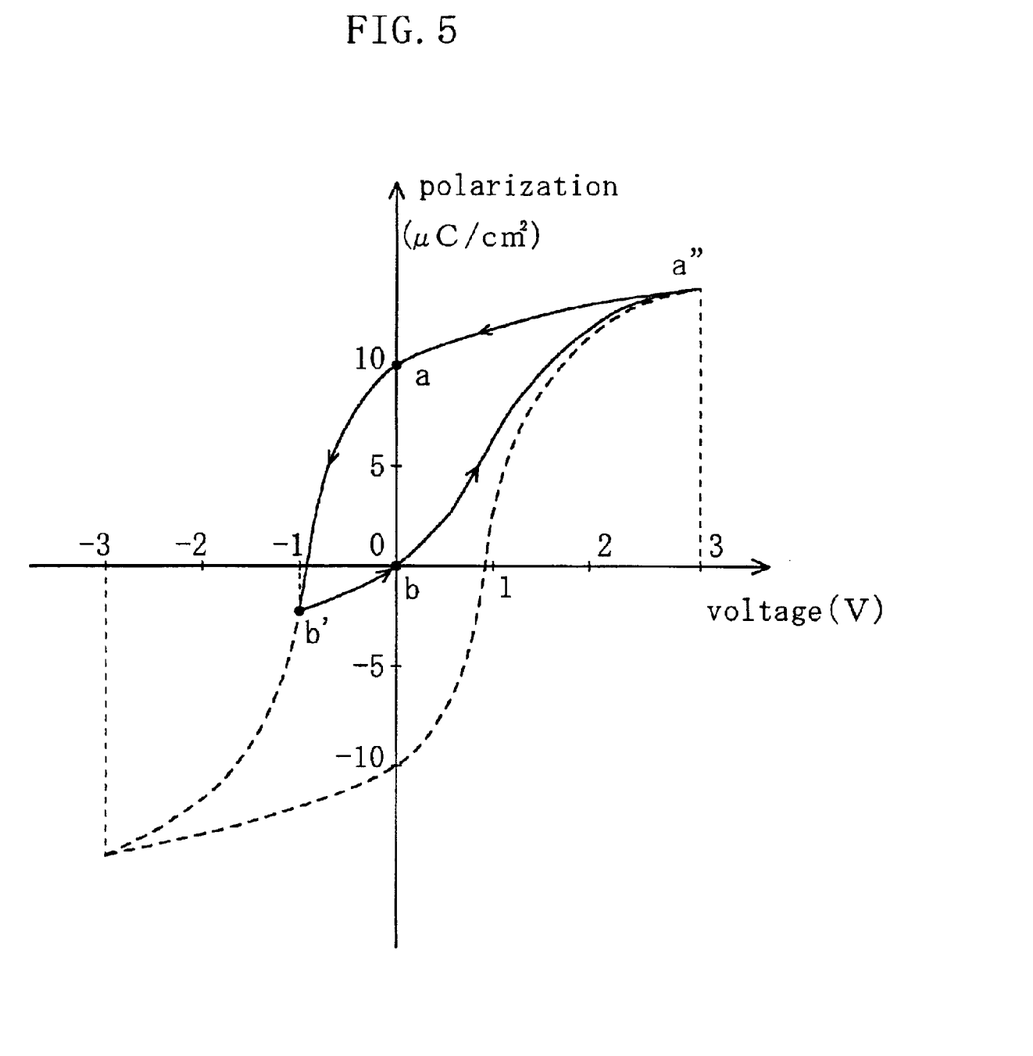
FIG. 5 is a hysteresis loop showing a relationship between the voltage and the polarization and illustrating a data write operation according to the first embodiment.

FIG. 5 is a hysteresis loop showing a relationship between the voltage and the polarization and illustrating a data write operation according to the first embodiment. In FIG. 5, the abscissa represents the voltage applied between the control gate electrode 24 and intermediate electrodes 22 (or gate electrode 14), while the ordinate represents the polarization created in the ferroelectric film 23. In FIG. 5, the down polarization is regarded as a positive one. In the following description, the silicon substrate 11 is supposed to be always at the ground level.

As shown in FIG. 5, before data is written, the polarization in the ferroelectric film 23 is almost zero. Accordingly, the polarization is located near the origin O of the graph. In writing data "1" on this ferroelectric film 23, the ground potential may be applied to the intermediate electrode 22 through the second interconnect 33b, while a voltage of 3 V may be applied to the control gate electrode 24 through the first interconnect 33a. Then, the polarization increases from the origin O to the point a" along the upward solid-line arrow. Thereafter, once the voltage, applied to the control gate electrode 24 through the first interconnect 33a, is removed, the polarization decreases from the point a" to the point a. As a result, a charge of about 10 $\mu$C/cm$^2$ (i.e., remnant polarization) is retained as data "1" in the ferroelectric film 23 at the zero voltage.

To rewrite the data "1" into data "0" after that, a voltage of about $-1$ V, not a voltage of $-3$ V needed for reversing the polarization into a negative saturated polarization, is applied to the control gate electrode 24 through the first interconnect 33a. On the other hand, the intermediate electrode 22 is kept at the ground level. According to the present invention, the data "0" represents a range between the negative saturated polarization state (with a charge of about $-10$ $\mu$C/cm$^2$) and almost zero polarization state (with a charge of about 0 $\mu$C/cm$^2$). Accordingly, the polarization representing the data "0" does not have to be decreased to about $-10$ $\mu$C/cm$^2$ but has only to be decreased to around 0 $\mu$C/cm$^2$ from the beginning. For that reason, when the voltage of about $-1$ V is applied to the control gate electrode 24 through the first interconnect 33a, the polarization changes from the point a into the point b' as shown in FIG. 5. This operation is also realized by applying a ground potential to the control gate electrode 24 through the first interconnect 33a and a voltage of 1 V to the intermediate electrode 22 through the second interconnect 33b, respectively. Thereafter, once the voltage, applied to the control gate electrode 24 through the first interconnect 33a, is removed, the polarization increases from the point b' to the point b. As a result, a charge of about 0 $\mu$C/cm$^2$ is retained as the data "0" in the ferroelectric film 23 at the zero voltage.

In the first embodiment, when a negative voltage, which has been applied to the ferroelectric film 23 that had a positive polarization, is removed, the polarization created in the ferroelectric film 23 (i.e., remnant polarization) reaches almost zero. Accordingly, a voltage substantially equal in magnitude to the negative voltage (i.e., the coercive voltage) may be applied according to this embodiment to rewrite the data from "1" into "0". In writing data "0" on the ferroelectric film 23 on which no data has been written yet, the coercive voltage (i.e., about $-1$ V in FIG. 5) is also preferably applied to the ferroelectric film 23.

After the data has been written, a ground potential is applied to the intermediate electrode 22 through the second interconnect 33b, thereby fixing the potential level at the gate electrode 14 connected to the intermediate electrode 22. Subsequently, using a switching transistor, for example, the second interconnect 33b, connected to the intermediate electrode 22, is electrically disconnected from peripheral circuits (not shown).

Alternatively, just before data is read out, a ground potential may be applied to the intermediate electrode 22 through the second interconnect 33b, thereby fixing the potential level at the gate electrode 14 connected to the intermediate electrode 22. This operation is performed to remove unnecessary charge that has been accumulated in the gate electrode 14 as a result of preceding write and read operations or leakage current in a standby state. Subsequently, using a switching transistor, for example, the second interconnect 33b, connected to the intermediate electrode 22, is electrically disconnected from peripheral circuits (not shown). Thereafter, to read out data, a read voltage VR is applied to the control gate electrode 24 through the first interconnect 33a. This read voltage VR is divided into a voltage supplied to the ferroelectric film 23 and a voltage supplied to the SiO$_2$ film 13. In this case, if the polarization in the ferroelectric film 23 is downward (i.e., in the data "1" state), then the direction of polarization created by the voltage supplied to the ferroelectric film 23 is the same as that of the polarization (or charge) retained in the film 23. Accordingly, neither the direction nor magnitude of the polarization changes because no disturb phenomenon occurs even after the read voltage VR has been removed.

However, it is a different story if the polarization in the ferroelectric film 23 is upward (i.e., in the data "0" state). In that case, the direction of the polarization created by the voltage applied to the ferroelectric film 23 is opposite to that of the polarization (i.e., charge) stored in the ferroelectric film 23. Thus, when a memory cell including the FeFET of the second embodiment is used, the ferroelectric film 23 is subject to the disturb phenomenon upon the application of the read voltage VR. As a result of the disturb phenomenon, the polarization is lost little by little and the source-drain current Ids representing the data "0" state also changes correspondingly.

In contrast, according to the writing method of the first embodiment, a polarization of about 0 $\mu C/cm^2$ has been retained as data "0" from the beginning. Furthermore, according to the first embodiment, the read voltage VR applied to the control gate electrode 24 through the first interconnect 33a is set so that the voltage supplied to the ferroelectric film 23 does not exceed the coercive voltage. Accordingly, the polarization is not lost due to the disturb phenomenon or the data "0" state does not switch into the data "1" state unexpectedly. Thus, even if the data "0" is read out repeatedly, the source-drain current Ids does not change. Specifically, the ratio of the voltage supplied to the ferroelectric film 23 to the voltage supplied to the gate oxide film 13 is determined by the ratio of a capacitance formed by the intermediate electrode 22, ferroelectric film 23 and control gate electrode 24 to a capacitance formed by the gate electrode 14, gate oxide film 13 and substrate 11. By adjusting this capacitance ratio and read voltage VR, the voltage supplied to the ferroelectric film 23 during reading can be equal to or smaller than the coercive voltage that switches the polarization state in the ferroelectric film 23.

To save the data written, the first and second interconnects 33a and 33b, connected to the control gate electrode 24 and intermediate electrode 22, respectively, are grounded to supply zero bias to the ferroelectric film 23 at the last stage of the preceding data write operation. Then, while the data is saved, the polarization will not be altered by the bias.

Thus, according to the first embodiment, data is written, rewritten, saved or read by associating the data "1" state with the down remnant polarization and the data "0" state with the up, non-saturated remnant polarization, respectively. As a result, in the data "1" state, the read current does not change so much due to the disturb phenomenon, and the read accuracy improves.

In the foregoing illustrative embodiments, the present invention has been described as being applied to a CMOS device including a MOSFET, of which the gate insulating film is made of silicon dioxide. Alternatively, the gate insulating film may also be a silicon oxynitride or silicon nitride film, for example. In other words, the present invention is broadly applicable to any MISFET in general.

What is claimed is:

1. A semiconductor device comprising:

a semiconductor substrate;

an MISFET, which is provided on the semiconductor substrate and includes a gate insulating film, a gate electrode and source/drain regions;

a ferroelectric FET, which is provided on the semiconductor substrate and includes a ferroelectric film provided over the semiconductor substrate, a control gate electrode provided on the ferroelectric film and source/drain regions;

a memory circuit block, in which the ferroelectric PET is arranged;

a control circuit block, in which the MISFET is arranged, for controlling the memory circuit block; and a logic circuit block, in which the MISFET is arranged, including a processor for transferring data to and from the memory circuit block.

2. The device of claim 1, wherein the ferroelectric FET further includes;

a gate insulating film provided on a part of the substrate, which part is located between the source/drain regions of the ferroelectric FET;

a gate electrode provided on the gate insulating film of the ferroelectric FET;

an interlevel dielectric film covering at least the gate electrode of the ferroelectric FET;

an intermediate electrode provided on the interlevel dielectric film; and a contact member connecting the intermediate electrode and the gate electrode of the ferroelectric FET together; and wherein the ferroelectric film is provided on the intermediate electrode.

3. The device of claim 2, wherein the gate electrode of the ferroelectric FET and the gate electrode of the MISFET are formed out of the same conductor film.

4. The device of claim 2, further comprising: a first interconnect connected to the intermediate electrode; and a second interconnect connected to the control gate electrode, and wherein polarization is created in the ferroelectric film with a voltage applied between the first and the second interconnects.

5. A method for fabricating a semiconductor device, comprising the steps of:

a) forming a gate insulating film and a gate electrode for each of first- and second-channel-type MISFETs and a ferroelectric FET over a semiconductor substrate;

b) implanting ions of a dopant for forming source/drain regions from over the gate electrode of the ferroelectric FET and the gate electrode of one of the first- and second-channel-type MISFETs;

c) implanting ions of another dopant for forming source/drain regions from over the gate electrode of the other MISFET;

d) forming an interlevel dielectric film covering the gate electrodes of the MISFETs and the ferroelectric FET, forming a contact hole, which passes through the interlevel dielectric to reach the gate electrode of the ferroelectric FET, and then filling the contact hole with a conductor material to form a contact member;

e) forming an intermediate electrode, a ferroelectric film and a control gate electrode over the interlevel dielectric film so that the intermediate electrode is connected to the contact member and that the ferroelectric film is in contact with an upper surface of the intermediate electrode and that the control gate electrode faces the intermediate electrode with the ferroelectric film interposed therebetween;

f) forming a memory circuit block, in which the ferroelectric FET is arranged;

g) forming a control circuit block, in which the MISFET is arranged, for controlling the memory circuit block; and h) forming a logic circuit block, in which the MISFET is arranged, including a processor for transferring data do and from the memory circuit block.

6. The method of claim 5, further comprising the steps of:

i) forming an upper-level dielectric film on the interlevel dielectric film after the step e) has been performed;

j) forming two contact holes which pass through the upper-level dielectric film to reach the intermediate and control gate electrodes of the ferroelectric FET, respectively, and then filling the contact holes with a conductor material to form first and second contact members, which make electrical contact with the intermediate and control gate electrodes, respectively; and k) forming first and second interconnects, which are connected to the first and second contact members, respectively, on the upper-level dielectric film.

* * * * *

UNITED STATES PATENT AND TRADEMARK OFFICE
CERTIFICATE OF CORRECTION

PATENT NO. : 6,787,830 B2
DATED : September 7, 2004
INVENTOR(S) : Yahuhiro Shimada et al.

It is certified that error appears in the above-identified patent and that said Letters Patent is hereby corrected as shown below:

Title page,
Item [56], References Cited, FOREIGN PATENT DOCUMENTS, delete the second "11-054716"

Column 12,
Line 1, "PET" should read -- FET --

Column 13,
Line 2, "do" should read -- to --

Signed and Sealed this

Third Day of May, 2005

JON W. DUDAS
*Director of the United States Patent and Trademark Office*